United States Patent [19]
Phipps et al.

[11] Patent Number: 5,365,099
[45] Date of Patent: Nov. 15, 1994

[54] SEMICONDUCTOR DEVICE HAVING HIGH ENERGY SUSTAINING CAPABILITY AND A TEMPERATURE COMPENSATED SUSTAINING VOLTAGE

[75] Inventors: John P. Phipps, Phoenix; Stephen P. Robb, Tempe; Judy L. Sutor, Chandler; Lewis E. Terry, Phoenix, all of Ariz.

[73] Assignee: Motorola, Inc., Schaumburg, Ill.

[21] Appl. No.: 202,856

[22] Filed: Feb. 25, 1994

Related U.S. Application Data

[63] Continuation of Ser. No. 37,501, Mar. 24, 1993, abandoned, which is a continuation of Ser. No. 278,988, Dec. 2, 1988, abandoned.

[51] Int. Cl.$^5$ .............................. H01L 29/10
[52] U.S. Cl. .................. 257/328; 257/363; 257/469; 257/539; 257/551
[58] Field of Search .......... 357/23.13, 13, 76, 59, 357/50, 4, 28, 23.4; 323/907; 257/328, 337, 355, 358, 359, 363, 469, 539, 551

[56] References Cited

U.S. PATENT DOCUMENTS

| | | | |
|---|---|---|---|
| 4,051,504 | 9/1977 | Hile . | |
| 4,075,649 | 2/1978 | Verderber | 357/13 |
| 4,599,631 | 7/1986 | Tsuzuki | 357/13 |
| 4,962,411 | 10/1990 | Tokura et al. | 357/23.4 |
| 5,012,313 | 4/1991 | Fujihira | 357/23.4 |

FOREIGN PATENT DOCUMENTS

| | | |
|---|---|---|
| 0060635 | 9/1982 | European Pat. Off. . |
| 0232589 | 8/1987 | European Pat. Off. . |
| 56-33877 | 4/1981 | Japan ........ 357/13 |
| 58-142578 | 8/1983 | Japan ..... 357/23.13 |
| 60-103658 | 6/1985 | Japan ........ 357/13 |
| 61-296770 | 12/1986 | Japan . |
| 1380466 | 1/1975 | United Kingdom ...... 357/23.13 |
| 2127214 | 4/1984 | United Kingdom .......... 357/13 |

OTHER PUBLICATIONS

Yoshida et al., "Novel Gate-Protection Devices for MOSFET's", 1982, pp. 81–84.

*Primary Examiner*—Andrew J. James
*Assistant Examiner*—Courtney A. Bowers
*Attorney, Agent, or Firm*—Joe E. Barbee; Miriam Jackson

[57] ABSTRACT

A semiconductor device having an improved protection scheme and a temperature compensated sustaining voltage is provided by integrating a plurality of temperature compensated voltage reference diodes between the drain and the gate of the semiconductor device. The diodes protect the device by clamping the device's sustaining voltage to the total avalanche voltage of the diode. The device will dissipate any excessive energy in the conduction mode rather than in the more stressful avalanche mode. In addition, the plurality of diodes will provide for a temperature compensated sustaining voltage of the semiconductor device. The plurality of diodes are formed back-to-back in polysilicon. The positive temperature coefficient of the avalanching junction of each diode pair is compensated for by the negative temperature coefficient of the forward biased junction.

21 Claims, 2 Drawing Sheets

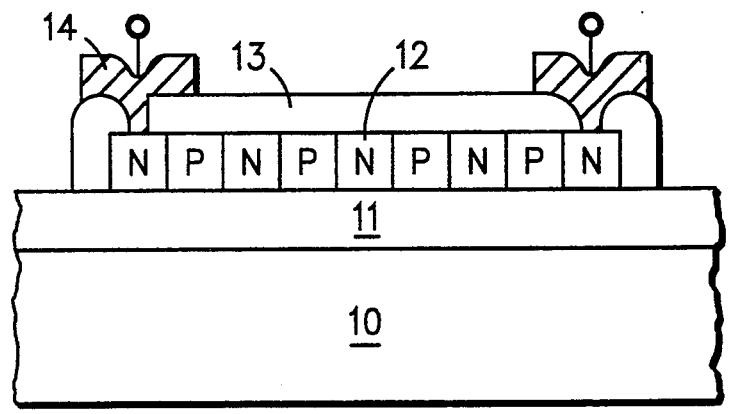
FIG. 1
FIG. 2
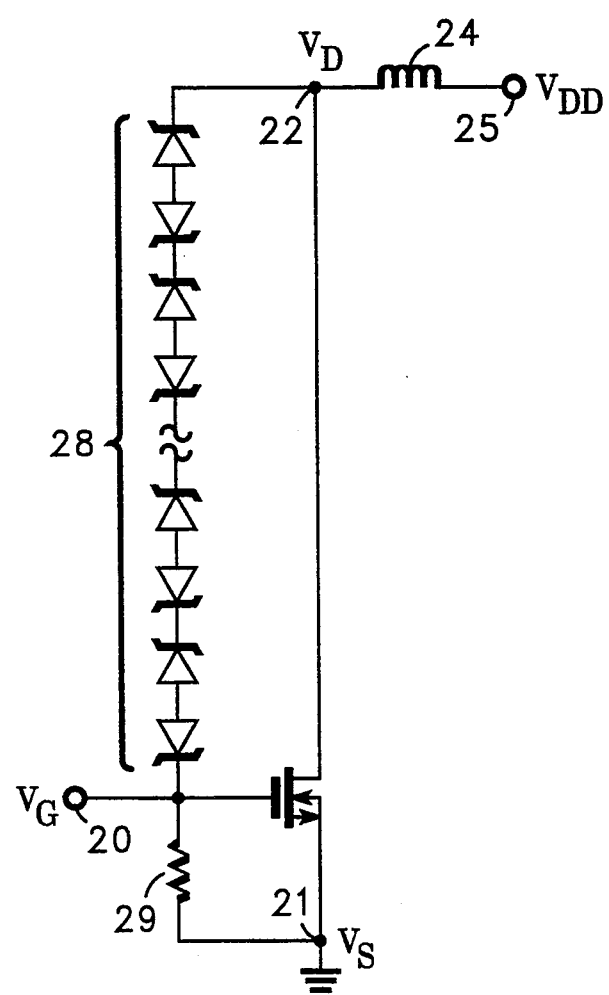

SEMICONDUCTOR DEVICE HAVING HIGH ENERGY SUSTAINING CAPABILITY AND A TEMPERATURE COMPENSATED SUSTAINING VOLTAGE

This application is a continuation of prior application Ser. No. 08/037,501, filed Mar. 24, 1993, now abandoned, which is a continuation of prior application Ser. No. 07/278,988, filed Dec. 2, 1988, abandoned.

BACKGROUND OF THE INVENTION

This invention relates, in general, to semiconductor devices and, more particularly, to a monolithic temperature compensated voltage reference diode and method of integration into a semiconductor device to achieve a temperature compensated sustaining voltage and high energy sustaining capabilities.

In the past, several schemes have been used to protect semiconductor devices from potentially destructive voltages and currents. Such conditions are commonly encountered in the application of power semiconductor devices. For example, a power semiconductor device such as a power MOSFET, is frequently used to switch inductive loads. When the power MOSFET is switched off, the energy stored in the inductor will force the drain voltage of the power MOSFET to rise rapidly above the supply voltage. If no limiting means are employed, this rise will continue until the drain-source avalanche voltage of the power MOSFET is reached, whereupon the energy stored in the inductor will be dissipated in the power MOSFET during device avalanche. Such dissipation can cause avalanche stress-induced failure of the power MOSFET.

A more manageable form of stress commonly occurs in the operation of power semiconductor devices as the device switches current on and off within its normal mode of conduction. Such operation of a power MOSFET occurs when the current in the power MOSFET channel region is, and remains, under the control of the power MOSFET gate. In this state, the device conduction stress can be regulated by appropriately modulating the signal on the power MOSFET gate. It is understood in the art of power MOSFET design and processing that device avalanche stress is more potentially destructive than device conduction stress.

Various processing techniques are commonly employed to render the internal parasitic elements of a power MOSFET less susceptible to avalanche-stress induced failure. A problem with these techniques is that normal variations in the processing parameters of a power MOSFET may inhibit optimization or reduce the effectiveness of these techniques.

Other methods of protection involve the application of external devices to render the power MOSFET less susceptible to avalanche stress. One such method involves using a drain-source clamp diode: an external diode connected between the drain and source of the power MOSFET, whose avalanche voltage is less than that of the power MOSFET. When the rising drain-source voltage reaches the avalanche voltage of the drain-source clamp diode, the energy stored in the inductor is dissipated in the drain-source clamp diode rather than the power MOSFET. The amount of energy that can be safely dissipated in this fashion depends on the dissipation capability of the drain-source clamp diode—large amounts of energy require large clamp diodes. While the drain-source clamp diode is dissipating the inductive energy, the power MOSFET is idle.

A more advantageous method of protection involves diverting a small fraction of the inductive energy to the power MOSFET gate by means of a drain-gate clamp diode whose avalanche voltage is about two to three volts less than the avalanche voltage of the power MOSFET. A suitable gate-source termination resistor is also employed in this method. When the rising drain voltage reaches the avalanche voltage of the drain-gate clamp diode, the resulting avalanche current develops a voltage across the gate-source termination resistor which turns on the power MOSFET, effectively clamping its drain to the sum of the drain-gate diode avalanche voltage and the voltage across the gate-source termination resistor. In this method the power MOSFET acts as its own clamp, and dissipates the inductive energy in the less stressful conduction mode. It is customary to add a second blocking diode in back-to-back configuration with the drain-gate clamp diode to enable the gate-source voltage in normal operation to exceed the drain-source voltage.

An advantage of using a drain-gate clamp over using a drain-source clamp is that the drain-gate diode, blocking diode, and gate-source termination resistor handle only enough energy to charge the power MOSFET input capacitances and therefore may be small in size and cost.

A disadvantage of these external clamp methods is that additional parts are employed to protect the power MOSFET, thus increasing the cost of the total system. In addition, the physical layout of some applications may preclude placing the clamp circuitry in close proximity to the power MOSFET. The resulting parasitic inductances act as impedances that slow the response time of the clamp circuitry. Therefore the power MOSFET may have to endure some avalanche stress until the clamps become active. It would be advantageous to provide a means of protecting the power MOSFET that achieves intimate proximity to the power MOSFET and does not increase the number of additional system components.

An additional problem that is difficult to control is the change in drain-to-source avalanche voltage of a semiconductor device with device junction temperature. For example, the drain-to-source avalanche voltage temperature coefficient of a 100V power MOSFET is about 9mV per degree Celsius. Additionally, wafer fabrication variations may result in an avalanche voltage spread of several volts for different wafer fabrication lots. While such variations are not a problem in many applications, some applications can require a tighter avalanche voltage distribution with less variation over temperature.

If a drain-gate clamp diode is selected to be a temperature compensated zener diode, the sustaining voltage of the power MOSFET, being clamped to that of the drain-gate clamp diode, will, to a great extent, also be temperature compensated. In the industry, temperature compensated zener diodes can be formed by arranging two diodes in back-to-back configuration, one with a zener avalanche voltage of about 5.5 volts and the other forward biased when the first is reverse biased. The zener diode has a positive temperature coefficient (TC) and the forward biased diode has a negative temperature coefficient. To achieve a temperature compensated voltage reference for the back-to-back to configuration, the positive temperature coefficient of the zener diode must be approximately equal in magnitude to that of the negative temperature coefficient of the forward-biased junction. It is well known in the art that a zener diode of about 5.5 bolts has a positive temperature coefficient approximately equal in magnitude to that of the negative temperature coefficient of a forward-biased junction. The resulting avalanche voltage of the two diode back-to-back "zero TC" configuration is about 6.2 bolts.

Higher sustaining voltage power MOSFETs with temperature compensation could be achieved by connecting a plurality of external zero TC zener diodes in series for use as a drain-gate clamp diode. Such a scheme would provide protection of the power MOSFET from avalanche stress and would provide a temperature compensated sustaining voltage, however, to do so would be cost prohibitive because it would greatly increase the system component count. In addition, the number of zero TC diodes may be limited by the physical layout of the system.

By now, it should be appreciated that it would be advantageous to provide an improved method of protecting a semiconductor device from avalanche stress which also provides a temperature compensated sustaining voltage of the semiconductor device.

Accordingly, it is an object of the present invention to provide a high voltage monolithic temperature compensated voltage reference diode which can be used to protect a semiconductor device and provide a temperature compensated sustaining voltage of the semiconductor device.

Another object of the present invention is to provide an integrated semiconductor device having an improved protection scheme and temperature compensated sustaining voltage.

A further object of the present invention is to provide a self-protecting, integrated semiconductor device which also exhibits a temperature compensated sustaining voltage.

An additional object of the invention is to provide a semiconductor device with a defined temperature coefficient of sustaining voltage.

SUMMARY OF THE INVENTION

In accordance with the present invention, the above and other objects and advantages are achieved by providing a high voltage monolithic temperature compensated voltage reference diode between the drain and the gate of a semiconductor device. The monolithic temperature compensated diode is comprised of a plurality of temperature compensated diode pairs. The diode pairs are formed in polysilicon, stacked back-to-back; the positive temperature coefficient of the avalanching diode being compensated for by the negative temperature coefficient of its forward biased companion. The diode can be used as an external drain-gate clamp or more preferably can be easily integrated into such devices as power MOSFETs, bipolar transistors, insulated gate bipolar transistors, and the like.

When the high voltage monolithic temperature compensated diode is used as a drain-gate clamp in a power MOSFET, the diode clamps the MOSFET's sustaining voltage to the total avalanche voltage of the diode. Inductive fly-back energy, such as is found when switching inductive loads, is dissipated by the power MOSFET in the conduction mode, rather than in the more stressful avalanche mode. In addition, the plurality of diode pairs provides for a temperature compensated sustaining voltage of the power MOSFET. The number of diode pairs may be varied to achieve various sustaining voltages independent of the avalanche voltage of the power MOSFET. Additionally, extra forward biased or reverse biased diodes may be added to or subtracted from the plurality to achieve a desired temperature coefficient.

BRIEF DESCRIPTION OF THE DRAWINGS

FIG. 1 illustrates an enlarged cross-sectional view of an embodiment of the present invention;

FIG. 2 illustrates a circuit diagram of a semiconductor device embodying the present invention.

Figure 3:
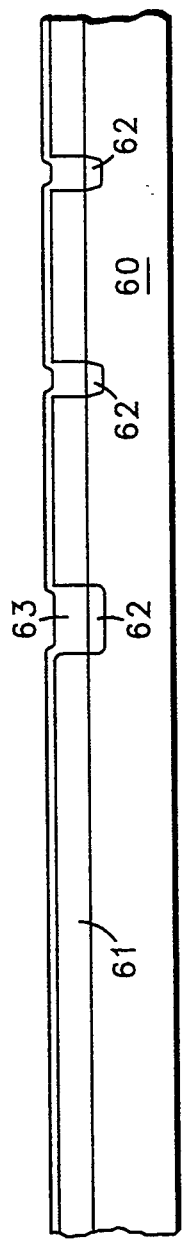
FIGS. 3–7 illustrate enlarged cross-sectional views of an integrated semiconductor device embodying the present invention.

The preferred embodiments of the present invention are illustrated in the accompanying drawings for purposes of exemplification, and are not to be construed as limiting in any manner.

DETAILED DESCRIPTION OF THE DRAWINGS

FIG. 1 illustrates an enlarged cross-sectional view of a structure embodying the present invention. First, a semiconductor substrate 10 is provided. Substrate 10 is preferably silicon of either N or P type material. Next, an insulating layer 11, preferably silicon dioxide, is grown or deposited on substrate 10. Subsequently, a polysilicon layer 12 is deposited on insulating layer 11. Then polysilicon layer 12 is subjected to a blanket implant and diffusion of a P-type dopant. The P-type dopant used in this embodiment is boron at a dose of approximately $5 \times 10^{12}$ to $1 \times 10^{16}$ atoms/cm$^2$. Other P-type dopants are also suitable. In the next step, polysilicon layer 12 is selectively implanted with an N-type dopant and then diffused. The N-type dopant used in this embodiment is phosphorus at a dose of approximately $1 \times 10^{13}$ to $1 \times 10^{16}$ atoms/cm$^2$. Other N-type dopants are also suitable. Note that polysilicon layer 12 can be doped N-type and then selectively doped P-type. Subsequently, an insulating layer 13 is deposited on polysilicon layer 12 and then selectively etched to provide contact areas to polysilicon layer 12 Next, a metallization layer 14 is deposited and etched to provide electrical contact to each end of polysilicon layer 12. Thus, a plurality of low voltage diodes, approximately 6–8 volts, can be stacked back-to-back in series to achieve a desirable high voltage. A zero TC diode is provided when the positive temperature coefficient of the avalanching junction is compensated for by the negative temperature coefficient of the forward biased junction. Furthermore, extra forward biased or reverse biased diodes may be added or subtracted from the plurality to achieve a desired temperature coefficient. The voltage, resistance and temperature coefficient can be tailored by the P-type and N-type dopant implantations. The widths of the P and N regions are preferably as small as process tolerances will allow to keep resistances down. The structure described requires few processing steps, thus a high voltage, monolithic temperature compensated voltage reference diode can be made at a very low cost.

The monolithic temperature compensating diode shown in FIG. 1 can be used as an external device, however, in some applications it would be more advantageous to integrate the diode into a semiconductor device itself. Integrating the diode into a semiconductor device would provide for better protection because the clamp will respond faster due to a lower impedance, and will thus prevent the semiconductor device from enduring stress. In addition, the cost of the system will be lowered because additional parts are not employed.

FIG. 2 illustrates a circuit diagram of an embodiment of the present invention. A power MOSFET will be used to illustrate where the present invention may be integrated, however, the invention is not limited to this specific device. The present invention can be used in other semiconductor devices, such as bipolar transistors, insulated gate bipolar transistors (IGBTs), thyristors, and the like. The MOSFET of FIG. 2 has a gate electrode or control electrode 20, a source electrode 21, and a drain electrode or current carrying electrode 22. In a bipolar device the gate would correspond to a base, the source to an emitter, and the drain to a collector. A polysilicon resistor 29 may be integrated into the MOSFET of FIG. 2 and electrically connected between gate 20 and source 21. Resistor 29 facilitates turn on of the power MOSFET. The MOSFET is illustrated switching an inductive load 24, attached to a supply voltage 25. A drain-gate clamp scheme is provided by placing a series of back-to-back diodes 28 between gate 20 and drain 22. Back-to-back diodes 28 are a series of low voltage diodes as shown in FIG. 1. The sum of the reverse and forward voltages of the plurality of diodes 28 provides for a clamping voltage lower than the avalanche voltage of the MOSFET. The plurality of the diodes 28 clamps the MOSFET's sustaining voltage to the total avalanche voltage of the diode. Thus, the power MOSFET dissipates any inductive fly-back energy, such as is found when switching inductive loads, in the conduction mode, rather than in the more stressful avalanche mode. In addition, the total voltage of the plurality of diodes 28 can be chosen to provide an avalanche voltage independent of the avalanche voltage of the semiconductor device. Furthermore, the plurality of diodes provides for a temperature compensated sustaining voltage of the power MOSFET. For example, the sustaining voltage of a 100 volt MOSFET can be maintained between approximately 95 and 105 volts between temperatures of −40° C. to 200° C. This voltage range includes the variation due to temperature and processing. Processing variations include variations in substrate resistivity and ion implant dose, among others. Prior art MOSFETs exhibit an avalanche voltage between approximately 90 and 125 volts for the same temperature range.

FIGS. 3–7 illustrate a preferred method of integrating back-to-back diodes 28 (shown in FIG. 2) into a power MOSFET. The process of fabricating a power MOSFET is well known by those skilled in the art, thus the process will only be discussed briefly. FIG. 3 illustrates an enlarged cross-sectional view of a power MOSFET in an early stage of fabrication. The fabrication of an N-channel MOSFET will be described, however, the plurality of diodes can also be easily integrated into a P-channel MOSFET. First, a semiconductor substrate 60 of N-type silicon is provided. Next, a silicon dioxide layer 61 is grown and patterned using standard techniques well known in the industry. Next, P-type regions 62 are formed in substrate 60, then another silicon dioxide layer 63 is grown on substrate 60.

Figure 4:
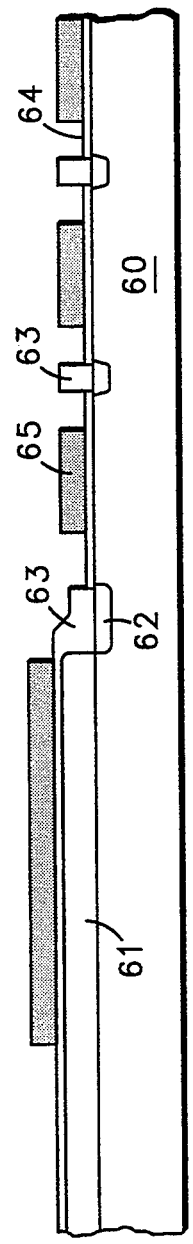

FIG. 4 illustrates the structure of FIG. 3 with oxide layers 61 and 63 selectively etched. A gate oxide 64 is taken grown on substrate 60. Gate oxide layer 64 does form over oxide layer 63, however, in FIG. 4 gate oxide layer 64 is only illustrated where it was grown directly over substrate 60. Next, a gate polysilicon layer 65 then is deposited and selectively etched. Before polysilicon 65 is etched a P-type dopant may be implanted into polysilicon layer 65 to further lower the resistivity of polysilicon 65.

Figure 5:
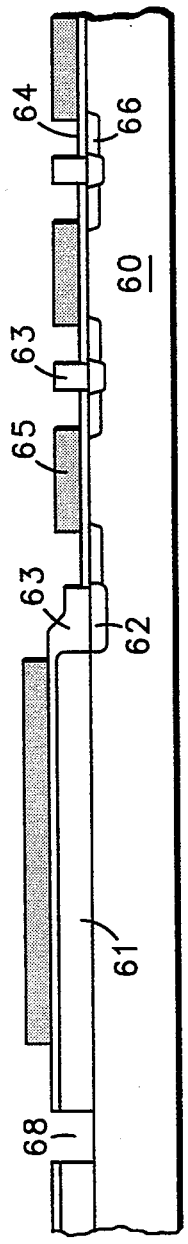

FIG. 5 illustrates the structure of FIG. 4 with a P-type channel region 66 implanted in substrate 60 through gate oxide layer 64. At this time, polysilicon layer 65 is also doped P-type, because layer 65 is not masked. Next, an opening 68 is defined in oxide layers 61 and 63.

Figure 6:
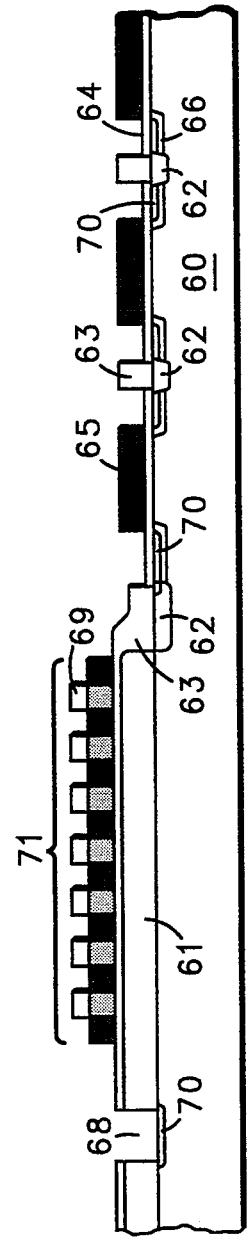

FIG. 6 illustrates the structure of FIG. 5 with a photoresist mask 69 masking alternating regions of a portion of polysilicon layer 65. Following the application of photoresist layer 69, the structure is implanted with an N-type dopant, forming regions 70 in substrate 60. At the same time, polysilicon layer 65 is doped N-type where there is no resist 69. Thus, alternating PN junctions, back-to-back diodes 71, are formed in a portion of polysilicon layer 65. A polysilicon resistor (not shown) may also be incorporated into polysilicon layer 65 and connected between gate 20 and source 21 if desired.

Figure 7:
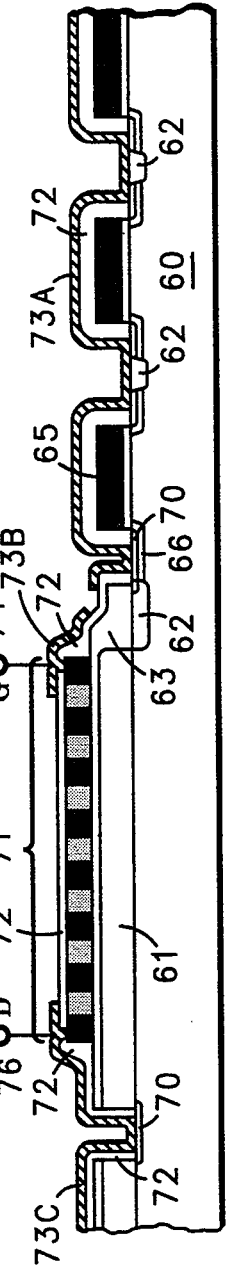

FIG. 7 illustrates a way that back-to-back diodes 71 may be connected to the gate electrode 74 and the drain electrode 76 of the semiconductor device. First oxide layer 72 is deposited and selectively etched to provide contact areas for a metallization layer. Note that some regions of oxide layer 63 are also etched along with oxide layer 72. A metallization layer is first deposited and then etched to form separate contacts 73A, 73B, and 73C. Metallization layer 73A makes electrical contact to a source area of the device. Metallization layer 73B makes electrical contact to gate electrode 74 of the semiconductor device and to the first junction of back-to-back diodes 71. Metallization layer 73C makes electrical contact to the last junction of back-to-back diodes 71 and drain electrode 76 of the device, In a vertical power MOSFET, as is illustrated, the drain is substrate 60. Electrical contact to drain electrode 76 can be made directly to metallization layer 73C without making contact to substrate 60. Other variations used to make electrical contact between gate electrode 74 and drain electrode 76 of the device will be apparent to those skilled in the art. It will also be apparent to those skilled in the art of processing power MOSFETs that only one extra photoresist masking layer is required to make the present invention.

By now it should be appreciated that there has been provided a new and improved method of fabricating an integrated semiconductor device having high energy capabilities and a temperature compensated sustaining voltage.

We claim:

1. A rugged power MOSFET having high energy protection, comprising:
   a semiconductor substrate having a polysilicon gate region, a source region, and a drain region thereon;
   a resistor electrically connected to the polysilicon gate region and the source region; and
   a plurality of temperature compensated voltage polysilicon diodes formed back-to-back adjacent a polysilicon gate pad region, and wherein the plurality of diodes make electrical contact to the polysilicon gate region and to the drain region and provide for high energy protection to the semiconductor device from avalanche stress-induced failure during operation of the power MOSFET.

2. The power MOSFET of claim 1 wherein the plurality of diodes each has a reverse and forward voltage sum of approximately 6.2 volts, and wherein the total sum of the forward and the reverse voltages of the plurality of diodes is less than, but substantially close to, the drain-source avalanche voltage of the MOSFET.

3. A semiconductor device having high energy protection, comprising:
 a semiconductor substrate having a gate region, a source region and a drain region thereon;
 a resistor electrically connected to the gate region and the source region; and
 a plurality of diodes formed back-to-back in a polysilicon layer over the substrate and connected between the gate region and the drain region, wherein the back-to-back diodes, having a reverse and forward voltage sum, clamp the sustaining voltage of the semiconductor device to the reverse and forward voltage sum of the diodes, which protects the semiconductor device from avalanche stress-induced failure.

4. A semiconductor device having a gate region, a source region, and a drain region, comprising;
 a plurality of diodes formed back-to-back in a polysilicon layer electrically connected to the gate region and the drain region of the semiconductor device and monolithically integrated with the semiconductor device;
 a resistor electrically connected to the gate region and the source region, wherein the plurality of diodes provide a temperature compensated sustaining voltage of the semiconductor device.

5. The device of claim 4 further comprising:
 the plurality of diodes having extra forward biased diodes to achieve a desired temperature coefficient.

6. The device of claim 4 further comprising:
 the plurality of diodes having extra reverse biased diodes to achieve a desired temperature coefficient.

7. The device of claim 4 further comprising:
 choosing a breakdown voltage of the plurality of diodes to provide protection to the semiconductor device from avalanche stress-induced failure.

8. The device of claim 4 further comprising:
 the plurality of diodes having a breakdown voltage less than the sustaining voltage of the semiconductor device to provide protection to the semiconductor device from avalanche stress-induced failure.

9. The device of claim 4 further comprising:
 the plurality of diodes having a breakdown voltage less than, but close to, the sustaining voltage of the semiconductor device to provide protection to the semiconductor device from avalanche stress-induced failure.

10. The device of claim 4 wherein the plurality of diodes each have a reverse and forward voltage sum, and wherein the total sum of the forward and the reverse voltages of the plurality of diodes provides for a specified avalanche voltage independent of an avalanche voltage of the semiconductor device.

11. The device of claim 4 wherein the resistor is monothically integrated onto the semiconductor device and is comprised of polysilicon.

12. The device of claim 4 wherein the semiconductor device is a power MOSFET.

13. A semiconductor device having a base region, a emitter region, and a collector region, comprising:
 a plurality of diodes formed back-to-back in a polysilicon layer electrically connected to the base region and the collector region of the semiconductor device and monolithically integrated with the semiconductor device;
 a resistor electrically connected to the base region and the emitter region, wherein the plurality of diodes provide a temperature compensated sustaining voltage of the semiconductor device.

14. The device of claim 13 further comprising:
 the plurality of diodes having extra forward biased diodes to achieve a desired temperature coefficient.

15. The device of claim 13 further comprising:
 the plurality of diodes having extra reverse biased diodes to achieve a desired temperature coefficient.

16. The device of claim 13 further comprising:
 choosing a breakdown voltage of the plurality of diodes to provide protection to the semiconductor device from avalanche stress-induced failure.

17. The device of claim 13 further comprising:
 the plurality of diodes having a breakdown voltage less than the sustaining voltage of the semiconductor device to provide protection to the semiconductor device from avalanche stress-induced failure.

18. The device of claim 13 further comprising:
 the plurality of diodes having a breakdown voltage less than, but close to, the sustaining voltage of the semiconductor device to provide protection to the semiconductor device from avalanche stress-induced failure.

19. The device of claim 13 wherein the plurality of diodes each have a reverse and forward voltage sum, and wherein the total sum of the forward and the reverse voltages of the plurality of diodes provides for a specified avalanche voltage independent of an avalanche voltage of the semiconductor device.

20. The device of claim 13 wherein the semiconductor device is a bipolar transistor, an insulated gate bipolar transistor, or a thyristor.

21. The device of claim 13 wherein the resistor is monothically integrated onto the semiconductor device and is comprised of polysilicon.

* * * * *